United States Patent [19]

Letort

[11] Patent Number: 5,468,297
[45] Date of Patent: Nov. 21, 1995

[54] WAFER BOAT FOR SUPPORTING SILICON WAFERS

[75] Inventor: Xavier Letort, Saint Cyr/Loire, France

[73] Assignee: SGS-Thomson Microelectronics, S.A., Saint-Genis, France

[21] Appl. No.: 196,976

[22] Filed: Feb. 16, 1994

[30] Foreign Application Priority Data

Feb. 24, 1993 [FR] France .................................. 93 02340

[51] Int. Cl.⁶ .......................... C23C 16/00; B65D 85/48
[52] U.S. Cl. ........................... 118/728; 206/454; 211/41; 29/25.01
[58] Field of Search ............................. 118/500, 728; 269/296, 297, 298, 299; 211/41; 206/454; 29/25.01, 25.01 B, 25.02

[56] References Cited

U.S. PATENT DOCUMENTS

| | | | |
|---|---|---|---|
| 3,826,377 | 6/1974 | Bachmann | 211/41 |
| 3,828,726 | 8/1974 | Dietze | 118/500 |
| 3,834,349 | 9/1974 | Dietze | 118/500 |
| 4,093,201 | 6/1978 | Dietze | 269/296 |
| 4,484,538 | 11/1984 | Sarkozy | 118/729 |
| 4,548,159 | 10/1985 | Foster | 118/728 |
| 4,569,452 | 2/1986 | Schülke | 206/454 |
| 4,676,008 | 6/1987 | Armstrong | 34/237 |
| 4,841,906 | 6/1989 | deGeest, Jr. | 118/500 |
| 4,987,016 | 1/1991 | Ohto | 428/34.1 |

FOREIGN PATENT DOCUMENTS 55-55518   4/1980   Japan .................................... 118/728

Primary Examiner—R. Bruce Breneman
Assistant Examiner—Jeffrie R. Lund
Attorney, Agent, or Firm—Wolf, Greenfield & Sacks

[57] ABSTRACT

A boat, for vertically holding semiconductor wafers, includes a cradle in the shape of a hollow half cylinder with a horizontal axis; two grooved plates, disposed against the interior lateral walls of the cradle accommodating the semiconductor wafers to be treated, the two plates being independent and abutting against the cradle without being fastened thereto; and a horizontal plate maintaining a distance between the two lateral grooved plates and serving as a removable guide during the loading operation of the semiconductor wafers.

37 Claims, 7 Drawing Sheets

WAFER BOAT FOR SUPPORTING SILICON WAFERS

BACKGROUND OF THE INVENTION

1. Field of the Invention

The present invention relates to a modular boat for supporting semiconductor wafers of any diameter.

2. Discussion of the Related Art

The semiconductor component industry subjects silicon wafers to various treatments during their manufacturing. Such treatments require the use of boats, generally made of quartz or silicon, to vertically maintain a number of such silicon wafers. In order to optimize the cost of semiconductor components, it is necessary both to simultaneously treat as many wafers as possible and to reduce the time duration of some treatments, by increasing the temperature, for example.

There are several types of boats, commonly used for treatments of silicon wafers. Exemplary conventional boats are shown schematically in FIGS. 1a–1d.

The boat schematically represented in FIG. 1a is formed by a shell 1, in the shape of a hollow half cylinder, that includes grooves 2, along the concave portion of the shell. The boat securely maintains wafers having a determined diameter, as each wafer is held by engagement of its base in a circular groove. However, a drawback of such a boat is that it is difficult to form adequate and regular grooves on rounded surfaces. Additionally, this boat does not allow a satisfactory circulation of gas around the wafers.

The boat represented in FIG. 1b is formed by a grooved plane 3 having a central aperture. Each silicon wafer 4 is held vertically by its insertion into grooves 5 disposed on both sides of the central aperture. The grooves provide two small-surface supporting areas close to the base of the wafer.

FIG. 1c is a perspective view of a boat formed by two parallel rails 6, located along the same horizontal plane, that include notches 7, equally distributed along the two rails. A silicon wafer is vertically held by simultaneously engaging it into a pair of opposing notches. This gives the base of the wafer two supporting areas, the sizes of which corresponding to the depth of the notches.

A drawback of the boats represented in FIGS. 1b and 1c is illustrated by FIG. 1e. With such boats, the vertical positioning of the silicon wafers 4 is maintained by only two small supporting areas 18 disposed near the bottoms of the wafers, the sizes of such areas corresponding to the depths of the opposing grooves or notches. The silicon wafers may therefore become slightly slanted. If the distance between grooves is too small, this slanting may cause the upper parts of two adjacent silicon wafers to touch, producing poor quality wafers after treatment. Therefore, it is not possible using the boats of 1B and 1C to treat a large number of tightly spaced wafers at once, as there is a risk that the wafers will touch.

Last, the boat of FIG. 1d is made of four rails. The upper and lower planes, 8 and 9, respectively, of the boat are horizontal. Each of the planes includes a pair of parallel rails, 10 for the upper plane and 11 for the lower plane, the distance between the lower rails being smaller than the distance between the upper rails. The rails include notches that are regularly spaced along their lengths, so that a pair of upper notches 12 and a pair of lower notches 13 are positioned along a same vertical plane. The rail assembly is rigidly held together by horizontal rods 14 and oblique rods 15. A silicon wafer is vertically held by its engagement into two pair of notches, 12 and 13, positioned along a same vertical plane, thus providing four support areas, the sizes of which corresponding to the depths of the notches. The silicon wafers are thus better held in such a boat than in the two preceding boats.

A drawback of this last boat, and more generally of all of the prior art boats, is that all these boats are rigid. Any mechanical stress applied to them immediately transmits to the wafers, where such stress can deform the wafers and impair their manufacturing quality. Indeed, if a high-temperature process is required for specific treatment in order to shorten the duration of a treatment cycle, thus improving the production efficiency, all these boats become deformed due to thermal expansion. Because of their rigidity, these boats directly transmit their deformations to the wafers, which therefore become impaired. They can, for example, get warped.

To summarize, since the various known boats consist of a single piece and are rigid, when used to their maximum loading capacity or at high temperature, they impair the treatment of the silicon wafers, either by deforming them or by irregularly treating them. This impairment compromises manufacturing efficiency and incurs excessive cost for the semiconductor component industry.

SUMMARY OF THE INVENTION

Thus, an object of the invention is to provide a modular boat that can be used for silicon wafers having various diameters and that avoids the drawbacks associated with the above-described prior art boats.

Another object of the invention is to provide a boat that can be fabricated easily and at low cost.

A further object of the invention is to provide a boat that can be used with various types of supports.

To achieve these objects, the invention provides a boat designed to vertically support semiconductor wafers, including a cradle shaped in the form of a hollow half cylinder, having a horizontal axis, and two grooved plates disposed against the lateral walls of the cradle accommodating the semiconductor wafers to be treated, the two plates being independent and abutting against the inside of the cradle without being fastened thereto.

According to an embodiment of the invention, the boat further includes a horizontal plate for spacing apart the two lateral grooved plates and for serving as a removable guide during the loading operation of the semiconductor wafers.

According to an embodiment of the invention, the various parts are made of quartz, silicon carbide, polycrystalline silicon or alumina.

According to an embodiment of the invention, the width of the horizontal plate is chosen as a function of the diameter of the wafers to be treated and as a function of the free height that it is desired between the base of the wafers and the bottom of the cradle.

According to an embodiment of the invention, the boat is placed in various supports, such as a pallet, a chute or a counter-tube, having an identical or a different diameter.

According to an embodiment of the invention, the boat is provided with supporting legs that allow it to be directly used free-standing.

The foregoing and other objects, features, aspects and advantages of the invention will become apparent from the following detailed description of the present invention when

DETAILED DESCRIPTION

Figure 2:
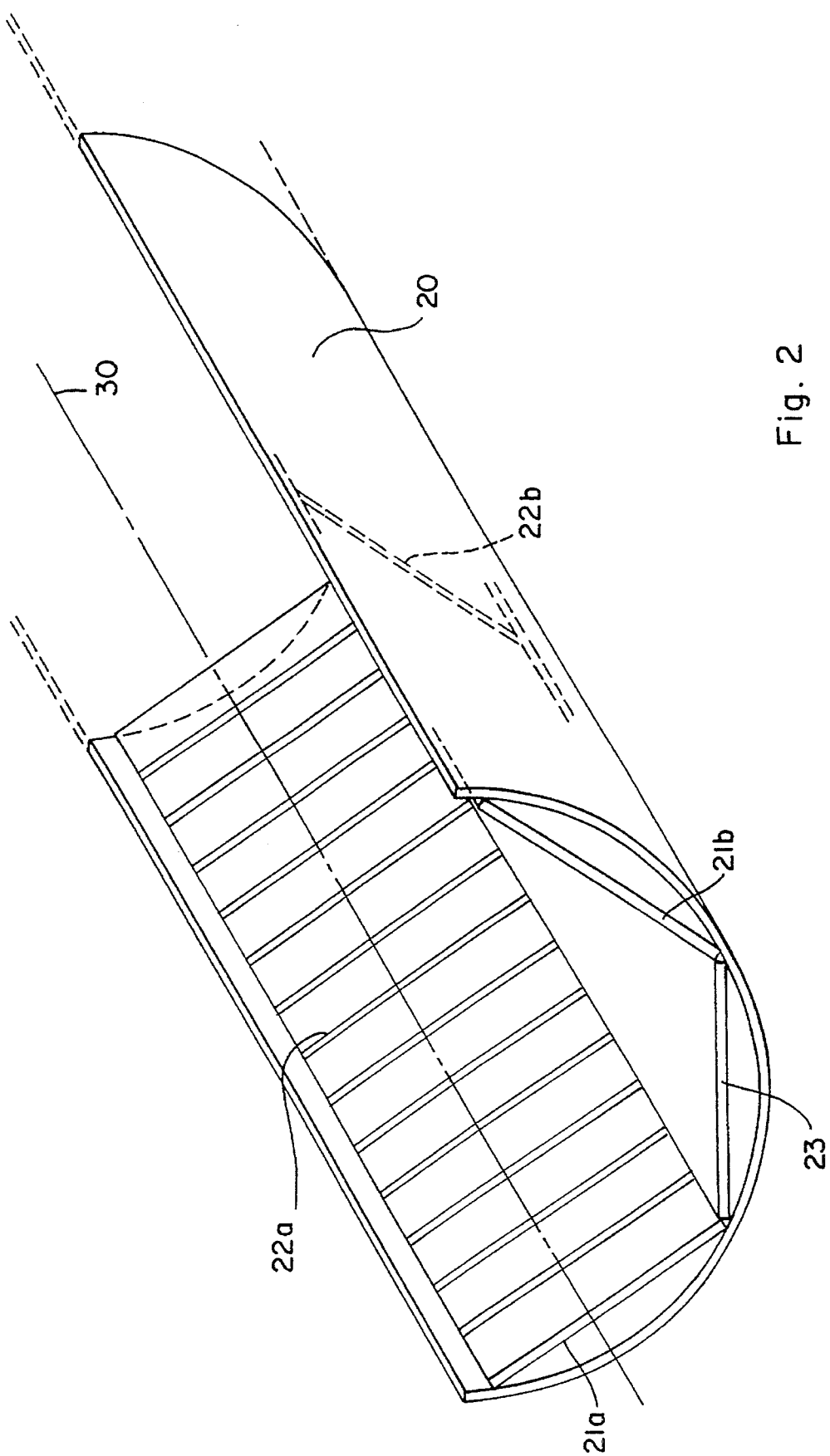
FIG. 2 is a perspective view of an empty boat according to the invention.

As represented in FIG. 2, a boat according to the invention includes four independent elements:

(1) a support or cradle 20, having the shape of a half cylinder with a horizontal axis 30, made of a material such as quartz, silicon carbide, polycrystalline silicon or alumina, (2) and (3) two plates, 21a and 21b, provided with grooves, 22a and 22b, respectively, with a strictly identical spacing between the grooves, and that are also made of a material such as quartz, silicon carbide, polycrystalline silicon or alumina, and (4) a horizontal plate 23 forming a removable loading guide, whose function will be described later.

Figure 3:
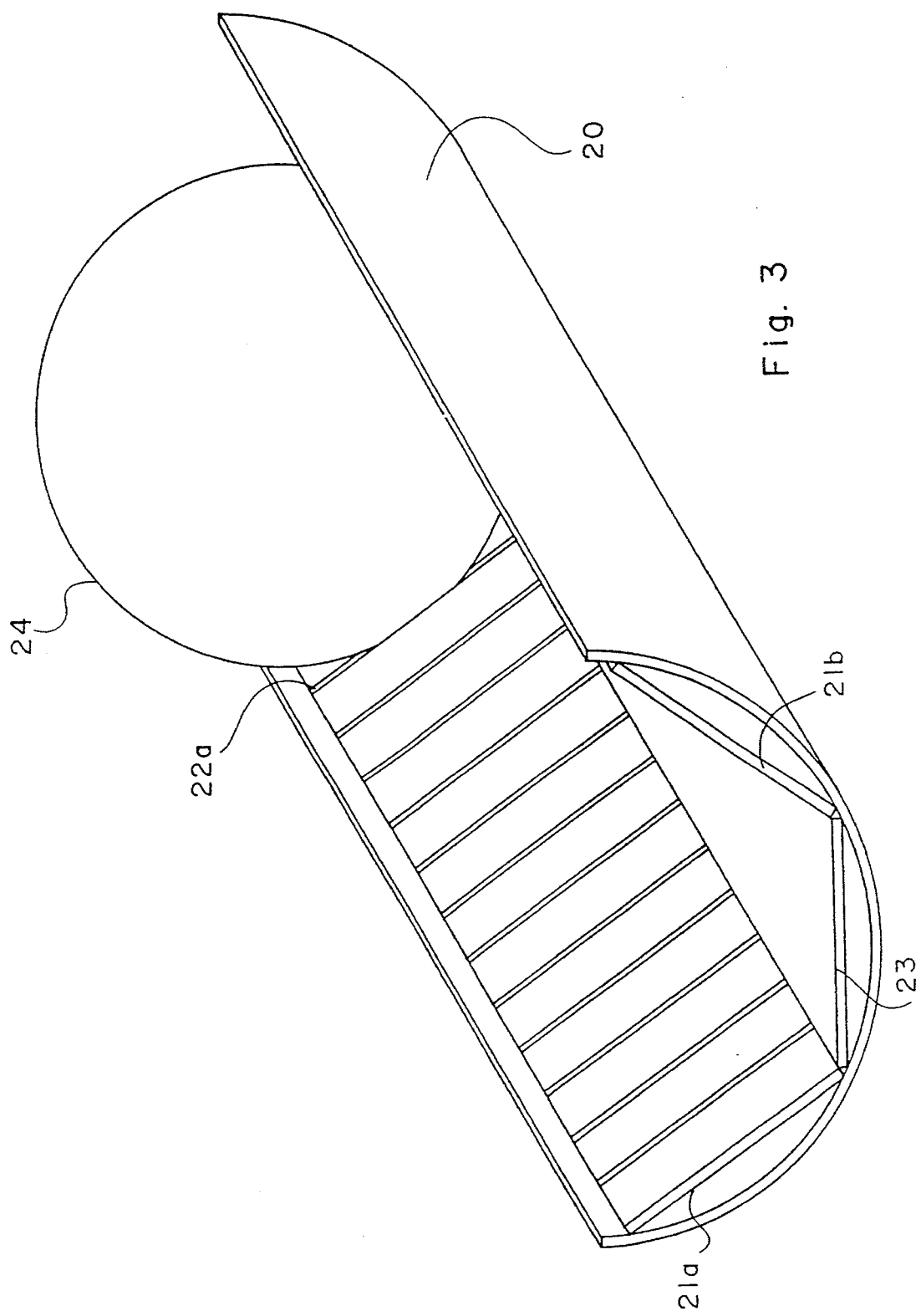
FIGS. 3–5 are perspective views of a boat according to the invention at various loading steps.
Figure 4:
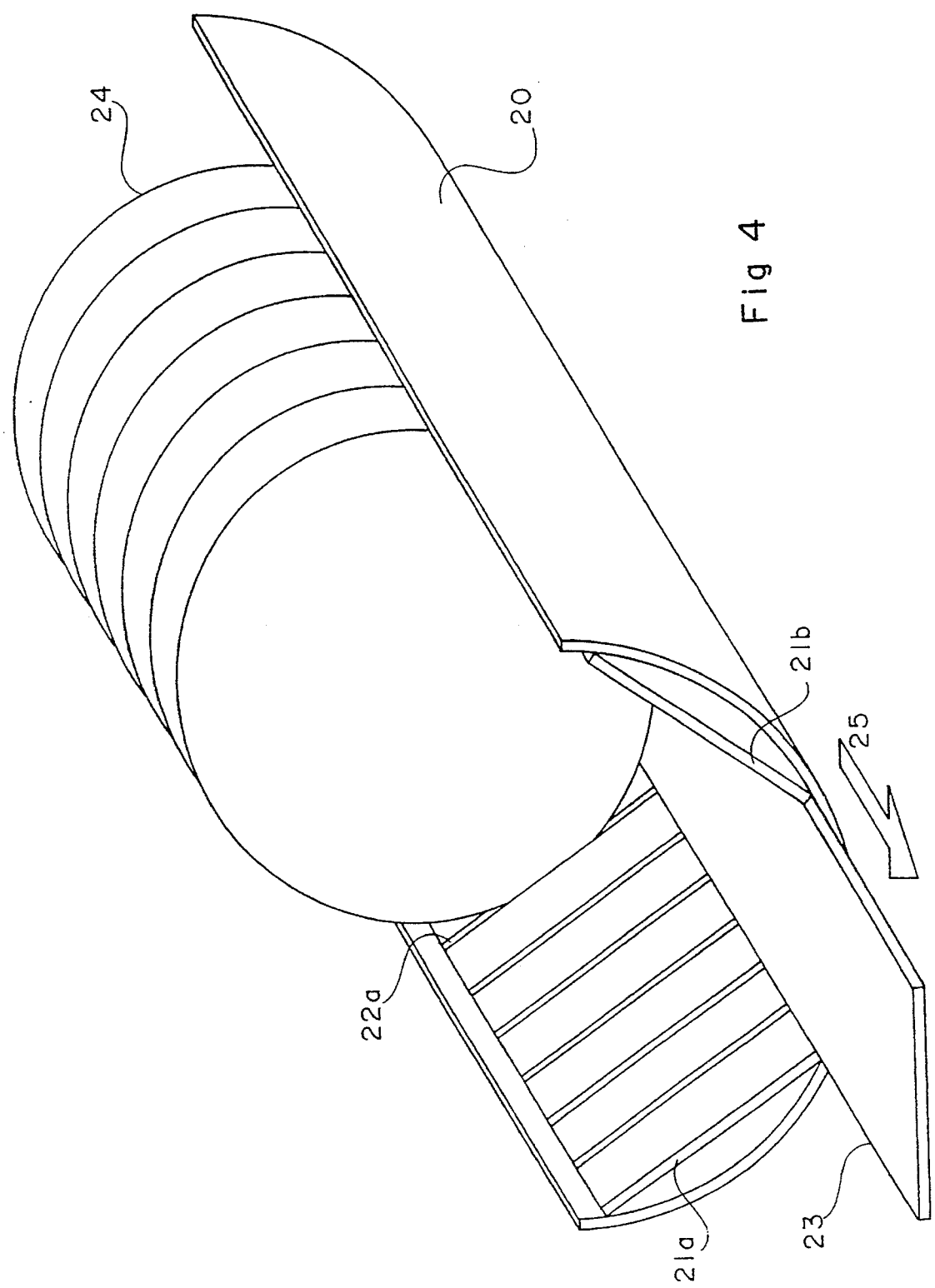
Figure 5:
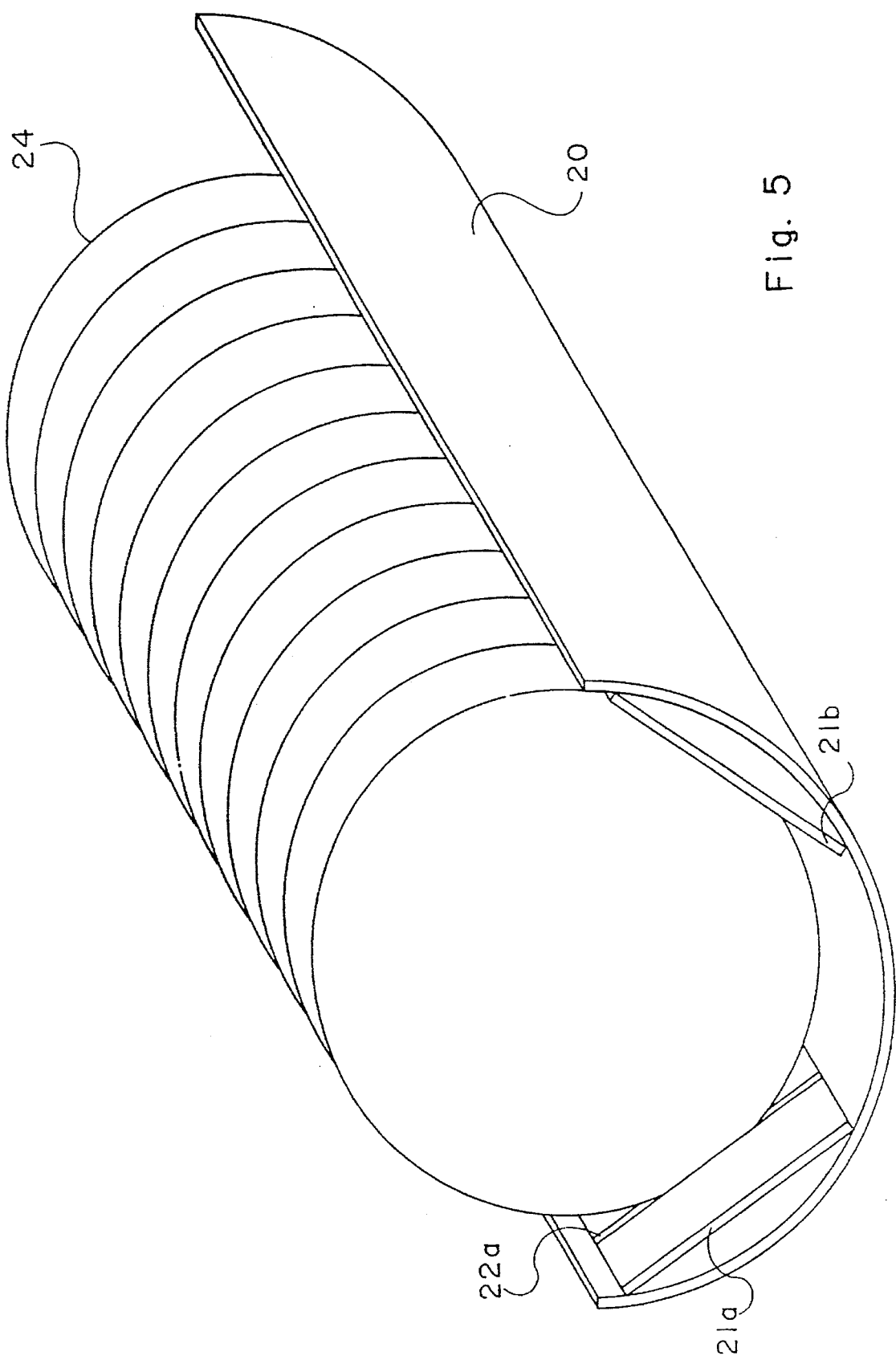

FIGS. 3–5 illustrate three successive steps for loading a boat according to the invention.

The first step, illustrated in FIG. 3, consists of placing the removable guide 23 horizontally in the hollowed portion of the half cylindrical support 20, between the two grooved plates 21a and 21b that lie against the internal walls of the cradle. In this manner, the three plates 21a, 21b and 23 form a U-shape opening vertically upward, with grooves 22a and 22b facing each another.

Once the assembly is formed, a first silicon wafer 24 is introduced into two opposing grooves 22a and 22b.

Then, a second silicon wafer is introduced into the grooves that are adjacent to the first grooves 22a and 22b. More wafers are introduced into consecutive, adjacent grooves. As shown in FIG. 4, as the silicon wafers are so introduced into cradle 20, removable guide 23 is pulled by translation out of the front of the boat, in the direction of arrow 25.

When cradle 20 is entirely loaded, as represented in FIG. 5, the removable guide 23 is completely pulled out of cradle 20. The strength of the assembly so loaded is ensured by the force of the silicon wafers against the lateral Grooved plates 21a and 21b.

It is also possible to carry out a mass loading of wafers with conventional transfer machines. The removable guide 23 in this case is pulled out at the end of the loading operation.

Figure 6A:
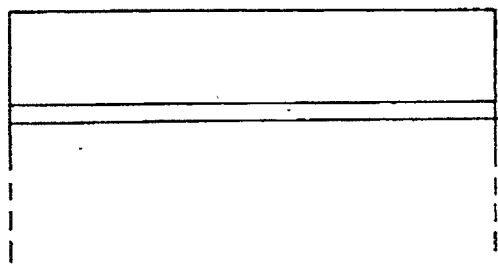
FIG. 6a is a top view.
Figure 6B:
FIG. 6b is a side view of a plate used in a boat according to the invention.
Figure 6B:
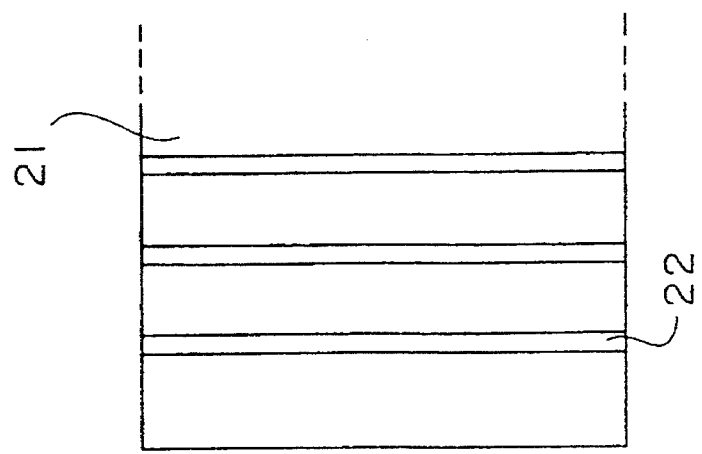
Figure 6B:
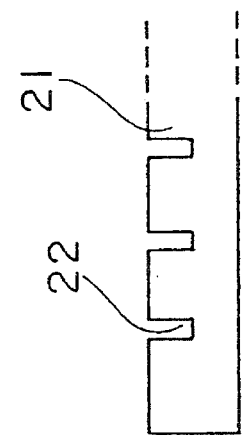

As shown by the top view of FIG. 6a and the side view of FIG. 6b, the plates 21 are particularly simple to fabricate. Grooves 22 can be accurately machined or can be etched using microlithography.

Figure 7:
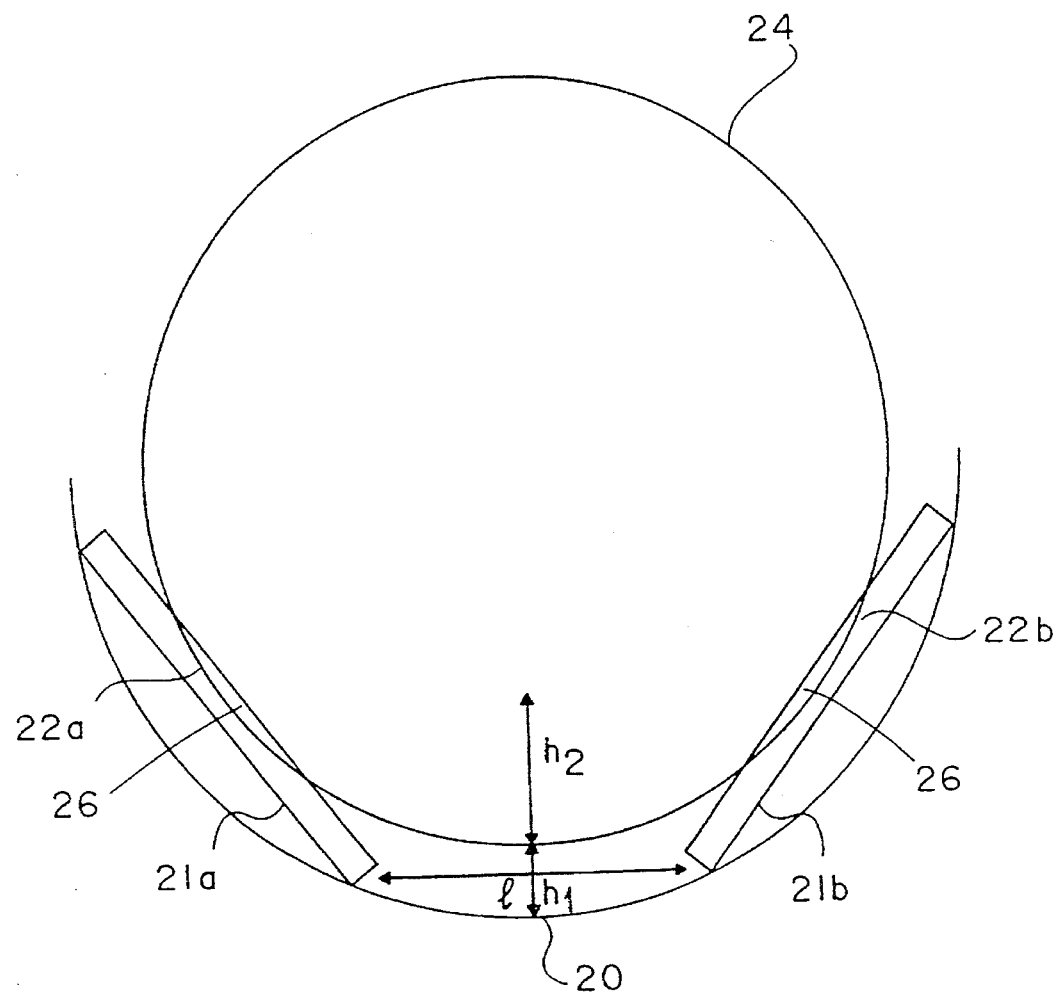
FIG. 7 is a front view of a loaded boat according to the invention.

FIG. 7 is a front view of a boat according to the invention loaded with wafers 24. In FIG. 7, $h_1$ is the free height between the base of the wafers and the bottom of cradle 20, $h_2$ is the height between the center of the holding region of the wafers in grooves 22 of plates 21 and the base of these wafers, and l is the distance between the lower edges of the grooved plates 21, length l thus corresponding to the width of loading guide 23.

The boat according to the invention, and its loading method, offer many advantages.

First, because its design provides the independent assembly of its various parts, the boat allows wafers having a wide range of diameters to be treated.

Additionally, as shown in FIG. 7, the supporting areas 26 of a silicon wafer 24 in grooves 22 of the lateral plates 21 are relatively large compared with the supporting areas of grooves in the prior art. These large areas prevent wafers from tilting forward or backward of a vertical plane, ensuring parallelism of the wafers regardless of the positions of the plates. Therefore, the boat according to the invention allows a large number of silicon wafers to be disposed over a small distance. For example, approximately 600 wafers can be disposed over an 80 cm length, without the risk that any two adjacent wafers will touch, as happens with some of the prior art boats, described above.

Further advantages result from the independent assembly of the elements of the boat according to the invention.

The choice of distance l and height $h_1$ allows the circulation of treatment gases beneath the wafer assembly to be adjusted. If, for given plates 21 and wafers 24, having a predetermined diameter, it is desired to modify one of heights $h_1$ or $h_2$, one has merely to replace the removable guide 23. For example, one can increase $h_1$ or $h_2$, by increasing l; that is, a broader guide is used. One can also adjust heights $h_1$ and $h_2$ without changing the guide, but by using different grooved plates 21. Thus, for wafers having a predetermined diameter and for a guide having a given width, $h_1$ and $h_2$ can be increased by using broader plates 21. Similarly, if it is desired to reuse the boat for wafers having a different diameter, for example a larger diameter, while maintaining the same height $h_1$ to ensure a proper treatment, it is sufficient to use a broader guide without changing plates 21, or to use narrower plates 21 without changing the guide. To sum up, because the elements of the boat are independent, heights $h_1$ and $h_2$ may be easily adjusted to match wafers having various diameters.

The independent assembly of the elements forming the boat according to the invention provides further advantages. For example, if plates 21 or cradle 20 undergo mechanical stress, then a slight displacement of plates 21 occurs, relieving the stress and reducing the risk of the wafers being deformed or irregularly treated. Likewise, during treatment of silicon wafers at a high temperature (1250° C.–1300° C.), the thermal expansion of the various elements of the boat according to the invention merely causes a slight displacement of the plates, but does not change the holding position of the wafers. Thus, the wafers do not become deformed, and in particular warped, as occurs with thin wafers when using prior art boats.

Last, the characteristic elements making up this boat and the loading operations entailed when using it have a low cost.

Figure 1A:
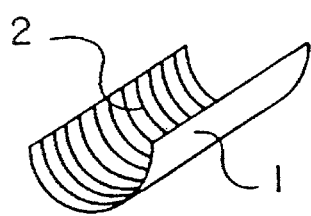
FIGS. 1a–1e, above described, schematically represent various prior art boats.
Figure 1B:
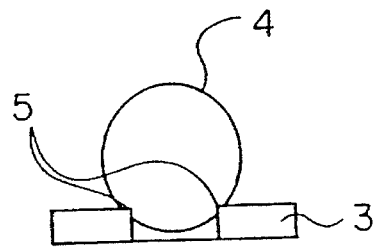
Figure 1C:
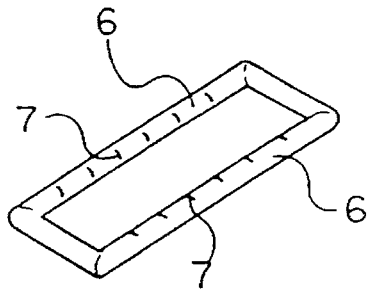
Figure 1D:
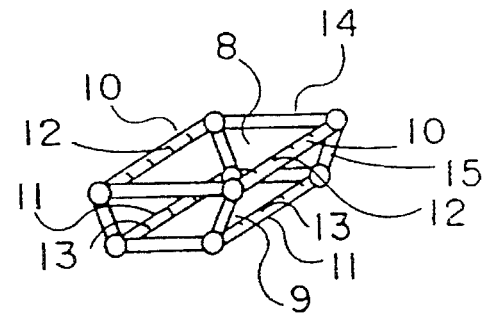
Figure 1E:
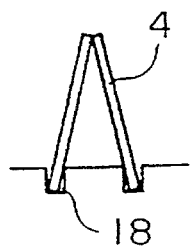

The boat according to the invention can be conventionally used, like the boat of FIG. 1a. It can be disposed on various supports, such as a pallet, a chute, or a counter-tube having an identical or a different diameter. Such a boat can also be provided with supporting legs that allow it to be directly used.

Having thus described one particular embodiment of the invention, various alterations, modifications, and improvements will readily occur to those skilled in the art. Such alterations, modifications, and improvements are intended to be part of this disclosure, and are intended to fall within the spirit and scope of the invention. Accordingly, the foregoing description is by way of example only and is not intended as limiting. The invention is limited only as defined in the following claims and the equivalents thereto.

What is claimed is:

1. A wafer-supporting boat for vertically holding semiconductor wafers, comprising:

a cradle in the shape of a hollow half-cylinder and having a horizontal axis, interior lateral walls, and a base; and two grooved plates, disposed against the interior lateral walls of the cradle, adapted to accommodate the semiconductor wafers to be treated, the two grooved plates abutting the cradle.

2. The wafer-supporting boat of claim 1, further comprising a horizontal plate spacing apart the two lateral grooved plates and serving as a removable guide during a loading operation of the semiconductor wafers.

3. The wafer-supporting boat of claim 2, wherein the cradle, grooved plates, and horizontal plate are made of quartz.

4. The wafer-supporting boat of claim 2, wherein the cradle, grooved plates, and horizontal plate are made of silicon carbide.

5. The wafer-supporting boat of claim 2, wherein the cradle, grooved plates, and horizontal plate are made of polycrystalline silicon.

6. The wafer-supporting boat of claim 2, wherein the cradle, grooved plates, and horizontal plate are made of alumina.

7. The wafer-supporting boat of claim 2, wherein the width of the horizontal plate is chosen as a function of a diameter of the wafers to be treated and as a function of a free height that is desired between the wafers and the base of the cradle.

8. The wafer-supporting boat of claim 1, placed in a pallet support structure.

9. The wafer-supporting boat of claim 1, placed in a chute support structure.

10. The wafer-supporting boat of claim 1, placed in a countertube support structure.

11. The wafer-supporting boat of claim 1, wherein the cradle further comprises supporting legs that allow the wafer-supporting boat to be used free-standing.

12. A wafer-supporting boat for holding semiconductor wafers having outer edges, comprising:

a cradle having a horizontal axis;

means, within the cradle, for supporting the semiconductor wafers, comprising a first part on one side of the horizontal axis and a second part on an opposing side of the horizontal axis, wherein the first and second parts are independently moveable within the cradle along the outer edges of the semiconductor wafers; and means, within the cradle, for aligning the wafers in parallel and in a substantially vertical orientation.

13. The wafer-supporting boat for holding semiconductor wafers of claim 12, wherein the means for supporting comprises the means for aligning.

14. The wafer-supporting boat for holding semiconductor wafers of claim 12, further comprising means for separating the first and second parts of the means for supporting in the cradle by a spacing distance.

15. The wafer-supporting boat for holding semiconductor wafers of claim 14, wherein the semiconductor wafers have one of a wide range of diameters.

16. The wafer-supporting boat for holding semiconductor wafers of claim 14, wherein a vertical clearance distance between the semiconductor wafers in the wafer-supporting boat and the cradle corresponds to the spacing distance.

17. The wafer-supporting boat for holding semiconductor wafers of claim 16, wherein a desired vertical clearance distance is attainable by varying the spacing distance.

18. The wafer-supporting boat for holding semiconductor wafers of claim 14, wherein the means for separating is removable.

19. The wafer-supporting boat for holding semiconductor wafers of claim 14, wherein the means for supporting rests in the cradle by force of gravity and friction without being fixedly attached thereto.

20. The wafer-supporting boat for holding semiconductor wafers of claim 12, further comprising means for supporting the wafer-supporting boat.

21. The wafer-supporting boat for holding semiconductor wafers of claim 20, wherein the means for supporting the wafer-supporting boat is legs.

22. A method for loading wafers into a wafer-supporting boat the wafer-supporting boat having a cradle, two grooved plates disposed within the cradle, and a removable base plate disposed between the two grooved plates, comprising the steps of:

inserting a number of wafers into the wafer-supporting boat so that the wafers each engage into a groove on each of the two grooved plates;

withdrawing the base plate along a horizontal axis a distance corresponding to the number of wafers inserted into the wafer-supporting boat and a horizontal distance separating one wafer from another wafer;

repeating the steps of inserting and withdrawing until the wafer-supporting boat contains a desired total number of wafers; and withdrawing the base plate completely from the wafer-supporting boat.

23. The method as set forth in claim 22, wherein the desired total number of wafers is inserted into the wafer-supporting boat in a single step of inserting.

24. The method as set forth in claim 23, further including, prior to any step of inserting, the step of replacing the base plate with another base plate having a different width.

25. The method as set forth in claim 23, further including the step of exposing the wafer-supporting boat to treatment gases.

26. The method as set forth in claim 23, further including the step of exposing the wafer-supporting boat to elevated temperature.

27. The wafer-supporting boat of claim 2, wherein the horizontal plate comprises a first horizontal plate having a width adapted so that the wafer-supporting boat accommodates wafers of a first size, the wafer-supporting boat further comprising:

an second horizontal plate having a width that is different from the width of the first horizontal plate, the second horizontal plate to be disposed in place of the first horizontal plate in the wafer-supporting boat to accommodate semiconductor wafers of a second size.

28. A wafer-supporting boat for holding semiconductor wafers, comprising:

a cradle having a horizontal axis and interior lateral walls; and two grooved plates constructed and arranged to receive the semiconductor wafers, the two grooved plates being slidably mounted on the interior lateral walls of the cradle.

29. The wafer-supporting boat of claim 28, further comprising a removable spacing plate disposed between the two grooved plates.

30. The wafer-supporting boat of claim 29, wherein the cradle further includes a base, and wherein the width of the removable spacing plate establishes a distance between the semiconductor wafers to be received in the two grooved plates and the base of the cradle.

31. The wafer-supporting boat of claim 29, wherein the removable spacing plate comprises a first spacing plate having a width adapted so that the wafer-supporting boat accommodates wafers of a first size, the wafer-supporting boat further comprising:

an second spacing plate having a width that is different from the width of the first spacing plate, the second spacing plate to be disposed in place of the first spacing plate in the wafer-supporting boat to accommodate semiconductor wafers of a second size.

32. A method for loading semiconductor wafers into a wafer-supporting boat, the method comprising the steps of:

A. inserting two grooved plates and a base plate into the wafer supporting boat such that the two grooved plates are disposed on opposing sides of the wafer-supporting boat with the base plate disposed between them;

B. inserting a plurality of wafers into the wafer-supporting boat so that each of the plurality of wafers engages a groove within each of two grooved plates; and C. withdrawing the base plate from the wafer-supporting boat.

33. The method of claim 32, wherein the step C includes withdrawing the base plate from an end of the wafer-supporting boat.

34. The method of claim 32, wherein step B includes a step of inserting the plurality of semiconductor wafers into the wafer-supporting boat one semiconductor wafer at a time, and wherein step D includes incrementally withdrawing, following each insertion of a semiconductor wafer, the base plate by a distance substantially equal to a distance between adjacent grooves of the two grooved plates.

35. The method of claim 33, wherein the wafer-supporting boat has a horizontal axis, and step C includes withdrawing the base plate from the wafer-supporting boat along the horizontal axis.

36. The method of claim 32, wherein step A includes inserting a first base plate having a width, the method further including the steps of:

D. removing the semiconductor wafers from the wafer-supporting boat;

E. inserting a second base plate into the boat between the two grooved plates, the second base plate having a width that is different from the width of the first base plate;

F. inserting a plurality of semiconductor wafers into the wafer-supporting boat so that each of the plurality of semiconductor wafers engages a groove within each of the two grooved plates; and G. withdrawing the second base plate from the wafer-supporting boat.

37. The method of claim 32, wherein the two grooved plates inserted in step A each has a length extending along a length of the wafer-supporting boat and a width, the method further including the steps of:

D. removing the semiconductor wafers from the wafer-supporting boat;

E. removing one of the two grooved plates to leave one of the two grooved plates remaining in the wafer-supporting boat;

F. inserting a third grooved plate in place of the one of the two grooved plates removed in the step E, the third grooved plate having a width that is different from the width of the one of the two grooved plates removed in the step E;

G. inserting a base plate between the one of the two grooved plates remaining in the wafer-supporting boat and the third grooved plate;

H. inserting a plurality of semiconductor wafers into the wafer-supporting boat so that each of the plurality of semiconductor wafers engages a groove in the one of the two grooved plates remaining in the wafer-supporting boat and in the third grooved plate; and I. withdrawing the base plate from the wafer-supporting boat.

* * * * *

UNITED STATES PATENT AND TRADEMARK OFFICE
CERTIFICATE OF CORRECTION

PATENT NO. : 5,468,297
DATED : November 21, 1995
INVENTOR(S) : Xavier LETORT

It is certified that error appears in the above-indentified patent and that said Letters Patent is hereby corrected as shown below:

On the title page, insert item

[73] Assignee: SGS-Thomson Microelectronics, S.A.
Saint Genis, Pouilly, France Signed and Sealed this Twentieth Day of February, 1996

Attest:

BRUCE LEHMAN

*Attesting Officer*  *Commissioner of Patents and Trademarks*